United States Patent
Solomon

[11] Patent Number: 6,146,457
[45] Date of Patent: Nov. 14, 2000

[54] THERMAL MISMATCH COMPENSATION TO PRODUCE FREE STANDING SUBSTRATES BY EPITAXIAL DEPOSITION

[75] Inventor: Glenn S. Solomon, Redwood City, Calif.

[73] Assignee: CBL Technologies, Inc., Redwood City, Calif.

[21] Appl. No.: 09/109,134

[22] Filed: Jul. 2, 1998

Related U.S. Application Data

[60] Provisional application No. 60/051,816, Jul. 3, 1997, and provisional application No. 60/051,688, Jul. 3, 1997.

[51] Int. Cl.[7] .................................... C30B 25/04
[52] U.S. Cl. ................. 117/90; 117/94; 117/95; 117/101; 117/913; 117/915; 117/952; 117/954
[58] Field of Search ................. 117/90, 94, 95, 117/101, 915, 913, 952, 954

[56] References Cited

U.S. PATENT DOCUMENTS

| | | | |
|---|---|---|---|
| 4,550,014 | 10/1985 | Baughman et al. | 117/915 |
| 5,073,230 | 12/1991 | Maeacas et al. | 117/915 |
| 5,620,557 | 4/1997 | Manabe et al. | 117/915 |
| 5,641,381 | 6/1997 | Bailey et al. | 117/915 |
| 5,679,152 | 10/1997 | Tischler et al. | 117/97 |
| 5,710,057 | 1/1998 | Kenney | 117/915 |

FOREIGN PATENT DOCUMENTS

| | | | |
|---|---|---|---|
| 0573943 | 12/1993 | European Pat. Off. | 117/94 |
| 2653132 | 5/1978 | Germany | 117/95 |

*Primary Examiner*—Robert Kunemund
*Attorney, Agent, or Firm*—Lumen Intellectual Property Services

[57] ABSTRACT

A method for producing thick, high quality GaN substrates uses an epitaxially deposited film is used as a substrate material for further device or epitaxial processing. The film is deposited using an epitaxial technique on a thin substrate called the disposable substrate. The deposited film is thick enough so that upon cooling the thermal mismatched strain is relieved through cracking of the lower disposable substrate and not the newly deposited epitaxy. The epitaxial film now becomes a platform for either further epitaxial deposition or device processing.

30 Claims, 6 Drawing Sheets

THERMAL MISMATCH COMPENSATION TO PRODUCE FREE STANDING SUBSTRATES BY EPITAXIAL DEPOSITION

CROSS-REFERENCE TO RELATED APPLICATIONS

This application claims priority from U.S. Provisional Patent Applications 60/051,816 and 60/051,688, both filed Jul. 3, 1997, and both of which are incorporated herein by reference.

BACKGROUND

1. Field of the Invention

The present invention relates to the field of the crystal growth of epitaxial films and substrates. In particular the invention relates to the crystal growth of thermally mismatched epitaxy and substrate, and to the crystal growth of substrates that cannot be manufactured by traditional bulk growth techniques.

2. Description of Prior Art

As the scope of process manufacturing widens from mature areas such as semiconductor and ceramic processing to new material systems with new applications, areas of research and development become dominant bottlenecks where previously the technology proceeded quickly and naturally. Such is the case with the wide bandgap semiconductor, GaN, where because of the high melting point of the material and the high vapor pressure of N over the liquid or solid near this temperature, it is currently impossible to fabricate bulk GaN crystals of usable size for semiconductor manufacturing. Thus, GaN films are made by deposition of the GaN on a non-native substrate material, typically sapphire, where a large lattice mismatch and thermal mismatch exists. The lattice mismatch is the difference in length of the appropriate fundamental crystal length (the lattice constant) between the substrate and the epitaxy. The thermal mismatch is the difference in the crystal size of the substrate and epitaxy as function of temperature. The resulting material has large dislocation densities which limits the performance of electronic and optoelectronic devices fabricated from this films. Although engineers are slowly succeeding in working around these mismatch problems, the industry's progress would be increased with an available native substrate.

Even the epitaxial deposition of GaN has been difficult and not paralleled in similar compounds such as GaAs. To fully investigate the epitaxial process researchers has gone back to simple epitaxy techniques such as hydride-vapor-phase epitaxy (HVPE). In this technique large GaN growth rates and thicknesses can be produced. However, when the GaN epitaxy exceeds approximately 10 $\mu$m the GaN films develop cracks upon cooling. These cracks are a mechanism to relieve the large strain that builds up in the GaN epitaxy-substrate system because of the thermal mismatch between the GaN film and that of the substrate material.

U.S. Pat. No. 5,679,152 to Tischler et al. discloses a method of making a single crystal GaN substrate by epitaxially depositing the GaN on a growth substrate. At the growth temperature the growth substrate is completely etched away, i.e. "sacrificed", either before or after the GaN deposition is complete. When the GaN layer is then cooled, there is no thermal mismatch because the sacrificial substrate is no longer present. This technique, however, has several disadvantages. Because the technique requires that the sacrificial substrate is completely removed at the high growth temperature, the deposition chamber must be divided into two and an etching process must be performed in one chamber while the deposition is performed in the other chamber. The additional etching required by this approach adds cost and complexity to the process. In addition, controlling these two processes and ensuring that they are properly isolated from each other can pose difficulties. It can also be difficult to hold the GaN layer in place after the sacrificial substrate is etched away.

There is additional prior art which falls into two categories: techniques that remove the unwanted substrate in a different process after growth, and techniques that allow the epitaxy to be grown strain-free, often called universal compliant substrates. An example of the former is the flip-chip bonding techniques, while examples of the latter are the epitaxial growth of materials on a thin Si film deposited on $SiO_2$ deposited on Si (SOI), and the epitaxial growth on a processed thin film that are suspended as a membrane on a post structure above an underlayer (called a Universal Substrate). Flip-chip bonding allows the substrate of an epitaxially deposited film to be removed after cooling by mounting the substrate-epitaxy structure upside down and subsequently removing the substrate. This does not account for any thermal mismatch problem in the original substrate-epitaxial system. The thin Si film on SOI allows the epitaxially deposited material to nucleate on the extremely thin Si film which floats on the oxide at the deposition temperature. The effect is similar in the Universal substrate case: A lattice mismatched material can nucleate and grow on the extremely thin Si region of the substrate which is separated from the rest of the substrate by the liquid oxide. It is the substrate that quickly conforms to the epitaxy's materials properties. However, the oxide solidifies before completely cooling and thus the effective substrate is now quite thick and thermal mismatch is relieved by cracking in the epitaxy—not the substrate. The Universal substrate cannot effectively be used to solve thermal mismatch problems because the cracking of either of the suspended substrate or epitaxy is fatal.

SUMMARY OF THE INVENTION

In view of the above, it is an object of the present invention to provide a thick and high quality substrate of GaN or related III–V, II–VI, or IV compounds or alloys, and a method for easily and inexpensively producing the same. In one aspect of the invention, a GaN substrate is grown on a disposable substrate using epitaxial deposition techniques, such that the epitaxial thickness is large enough that upon cooling the total thermal mismatch strain energy exceeds the material limit of the disposable substrate before exceeding the material limits of the epitaxy. Thus, the disposable substrate undergoes plastic relaxation upon cooling instead of the epitaxy. Significantly, there is no need to remove the disposable substrate in order to avoid the creation of defects due to thermal mismatch during cool down. Typically, the thickness of the epitaxy is on the order of the same thickness of the substrate. Prior art epitaxy, in contrast, is generally one or two orders of magnitude thinner than the substrate. The relative thicknesses of the substrate and the epitaxy in the present invention are selected in dependence upon the materials used so that defects are generated in the substrate during cool down rather than the epitaxy.

In another aspect of the invention, a technique is provided for preprocessing the backside of the disposable substrate to facilitate the preferential cracking of the disposable substrate. The preprocessing involves patterning the surface of the thin substrate on a fine scale.

In another aspect of the invention, a suitably thin compound substrate is provided that is well suited as a epitaxial growth surface. The compound substrate is composed a thin layer of material deposited on one surface of a thicker foundational substrate. The thin predeposited layer, called an interlayer, possesses the necessary properties of a nucleating surface for the GaN deposition. In this way the most easily obtainable foundational substrate can be used in conjunction with a predeposited thin interlayer film that is better suited as a nucleating surface for the thick epitaxial film.

In another aspect of the invention, a method is provided for producing a thick GaN substrate by deposition on a compound substrate comprising a thin intermediate layer on top of a foundational substrate. During cool down the intermediate layer cracks, relieving the thermal mismatch strain in the epitaxial top layer. This interlayer may be patterned as with the substrate.

In another aspect of the invention, a method is provided to produce a substrate of GaN or a related compound using a vapor-phase epitaxy technique. Related compounds include all of the III–V group of compounds and their alloys.

This invention solves the problem of thermal mismatch induced cracking of an epitaxial film when the substrate-epitaxy system is cooled from the growth temperature. The invention relies on the deposition of an epitaxial film whose thickness is large enough so that upon cooling the strain energy in the substrate exceeds a value at which cracks are generated to relieve this strain before such a point is reached in the epitaxy. Once strain relieving cracks have formed in the substrate, the strain in the epitaxy is relieved and no cracking is generated in the epitaxy. The structural integrity of the epitaxy is preserved because the structural integrity of the substrate is sacrificed and the substrate is thus disposable, although it is not necessary to actually dispose or remove the cracked substrate from the epitaxy. Modifications to the invention to aid the cracking of the disposable substrate include pre-processing the thin disposable substrates on the backside of the substrate with etched patterns to aid the cracking. The etched patterns produce areas in the substrate that are even thinner and create stress concentration areas that aid in the substrate cracking.

Embodiments of the invention make use of two fundamental techniques. One is an epitaxial growth technique in which it is practical to deposit epitaxial films of the thickness equal to or exceeding that of the substrate. The second technique is the use of a suitable disposable substrate that can be made thin so that the effective epitaxial thickness can exceed that of the substrate. Using current technologies it is now possible to achieve this goal; however, in some instances an appropriately thin substrate may be more readably available, but may not be suitable for use as a substrate material for high quality epitaxy. In such a situation the invention makes use of a third technique, namely, the pre-deposition of an additional material upon the thin substrate. This additional interlayer is more suitable for high quality epitaxial growth, and it thus an important aspect of this invention. We call the pre-deposition layer an interlayer. The interlayer is a specific type of buffer layer added to a substrate before the critical epitaxial component. Accordingly, the interlayer-substrate combination is also called a substrate since it is the substrate with respect to the deposition of the desired epitaxy film. Furthermore, in some situations the invention may be more easily executed by the deposition of a different type of interlayer, so that when the thick material is deposited on top of the interlayer and cooled, the interlayer absorbs the thermal mismatch strain and cracks. Note that in one incarnation of the invention the interlayer serves as a special buffer layer between a good disposable substrate choice that may produce poor quality epitaxial material, and the thick epitaxial material desired. Thus, in this incarnation the special interlayer acts to improve the final epitaxial quality. In the other interlayer incarnation, the thin interlayer is decoupled enough from the substrate or epitaxy so that the interlayer component of the compound substrate cracks or delaminates upon cooling. A fourth technique that is important aspect of the invention is the use of patterned substrates to facilitate preferential cracking of the substrate rather than the epitaxy layer during cool down. This technique can also be applied in the case of a compound substrate, in which case either the interlayer, the foundational substrate, or both may be patterned to facilitate preferential cracking of the interlayer or the foundational substrate. In the case of a patterned interlayer, a portion of the epitaxy near the interlayer and between patterns may also experience preferential cracking, while the bulk of the epitaxy remains intact.

BRIEF DESCRIPTION OF THE DRAWINGS

FIGS. 7A and 7B are side view diagrams of a substrate that has been processed to create a pattern of sharp pits on its bottom surface to facilitate defect generation and propagation. FIG. 7A shows the patterned substrate prior to deposition, while FIG. 7B shows the same substrate after cracking due to thermal mismatch with the deposited epitaxy.

DETAILED DESCRIPTION

The present invention resolves a long-standing problem in epitaxially depositing a material on a substrate in which the thermal mismatch between the epitaxial layer and the substrate induces defect generation in the epitaxial layer. The thermal mismatch is defined as the difference in the change of the lattice constants of two materials with respect to changing temperature. Prior art in this field is largely limited to techniques for depositing materials with a large lattice mismatch between the epitaxial layer and the substrate. The lattice mismatch is defined as the difference in the lattice constants of the epitaxy (or each component of the epitaxy) and the substrate. In most techniques to eliminate the effects of lattice mismatch the epitaxial layer is much thinner than the substrate. The present invention differs from these prior techniques in both the problem it solves and the method of solution. The present invention is directed to solving the problems associated with thermal mismatch, not lattice mismatch. In addition, the present invention does not use epitaxial layers that are thinner than the substrate, but rather uses epitaxial layers that are much thicker than the substrates upon which they are deposited.

This invention is most favorably applied to a process in which the epitaxial layer can be made of sufficient thickness such that the thermal mismatch strain that develops upon temperature change is predominately accommodated by defect generation in the substrate and not in the epitaxy. In the case of compound substrates, the defect generation may take place in the foundational substrate, in a thin interlayer deposited on the foundational substrate, or in both. The invention can be applied to the fabrication of a thick, epitaxially deposited film on a disposable substrate. In the case of a material system such as GaN, InN, AlN or their alloys, these materials can be deposited on a disposable substrate and used as a homoepitaxial substrate for further device quality epitaxy. Although the invention applies to these various material systems, for purposes of illustration it will be described primarily in relation to the production of GaN substrates, which is defined as including all the variants of GaN which are doped with other elements.

Figure 1A:
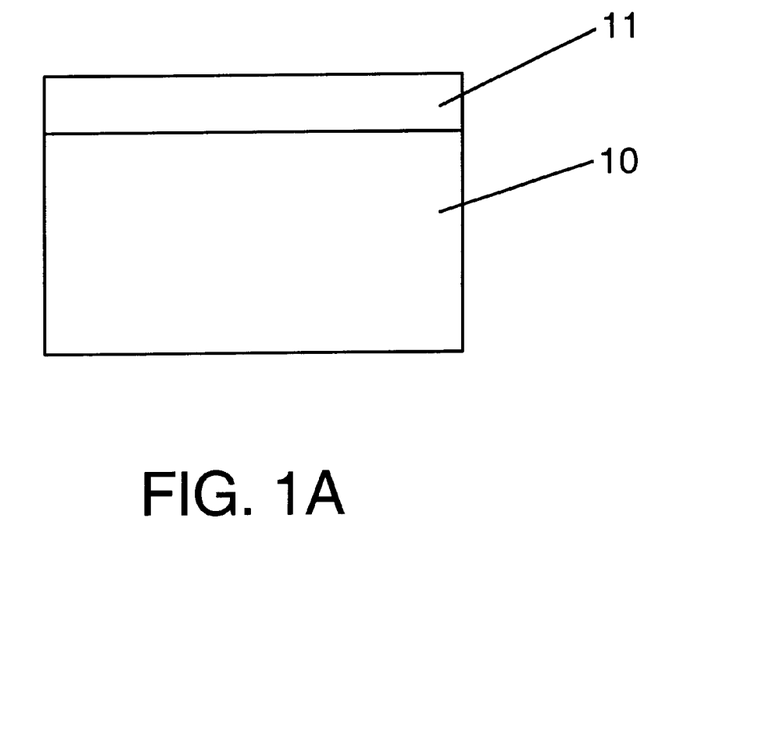
FIGS. 1A and 1B are side view diagrams showing in 1A a crack-free epitaxy film and typical substrate at the growth temperature and in 1B the same article where the thinner epitaxial film has cracked when cooled because of thermal mismatch, as known in the prior art.
Figure 1B:
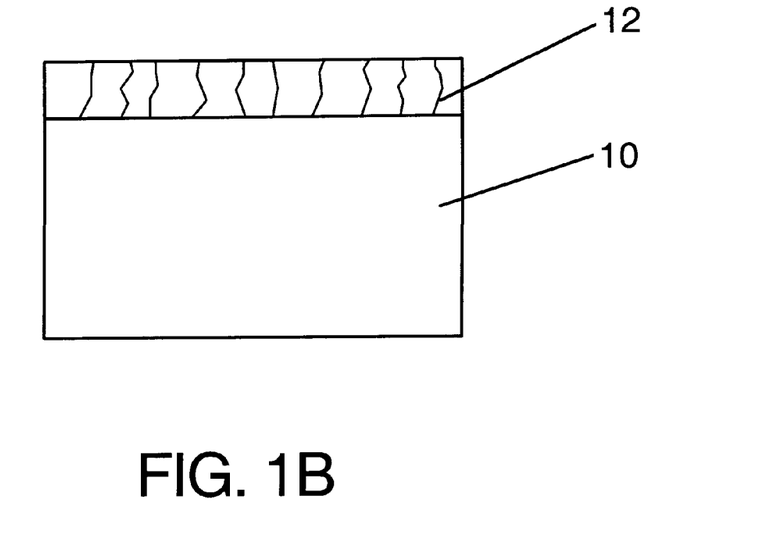

FIG. 1a shows a cross section of a conventional thin epitaxially deposited film 11 on a relatively thick substrate 10 which is at the growth temperature. i.e., the temperature at which the epitaxial deposition takes place. Typically, the substrate is on the order of 300 microns thick and the epitaxial layer is on the order of 1 to 10 microns thick (i.e. the substrate is 30 to 300 times thicker than the epitaxial layer). In FIG. 1b the epitaxial layer and substrate have been cooled. The deposited layer and substrate were free of strain at the growth temperature, but because of the thermal mismatch between the two materials, upon cooling strain develops in the structure. This strain will exist in both the epitaxy and substrate until the accumulated energy associated with the strain will exceed the energy required to create a structural change to relieve this strain. An example of such a structural change is a dislocation or crack 12; if the accumulated strain energy in either the substrate or the epitaxy exceeds the energy needed to generate a crack or dislocation, the dislocation or crack is created, propagates and relieves the strain. Whether the accumulated strain energy first exceeds a value for defect generation in the epitaxy or substrate depends on the stiffness of the two materials, the energy needed to generate the strain relieving defect in the each material, and finally the thicknesses of each material.

Figure 2A:
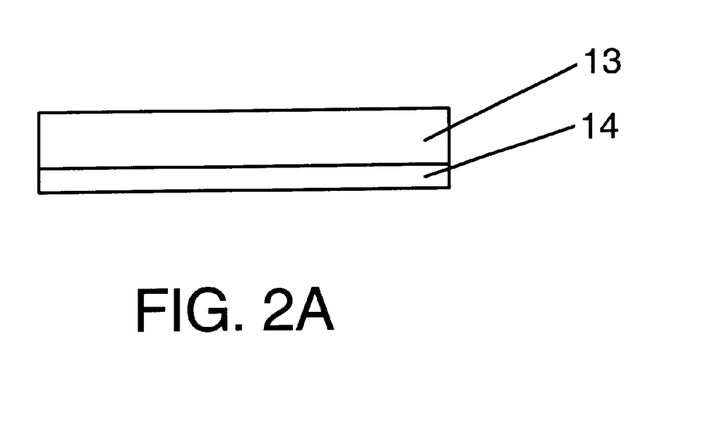
FIGS. 2A and 2B are side view diagrams according to the present invention showing in 2A a clean, crack-free epitaxy film and disposable substrate at the growth temperature, and in 2B the same article where now the thicker epitaxial film is crack-free when cooled, but the thinner substrate has cracked due to thermal mismatch.
Figure 2B:
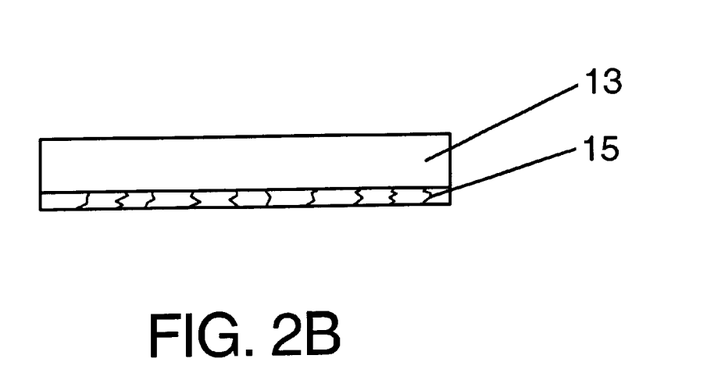

FIG. 2a shows an epitaxial layer 13 deposited on a substrate 14 at the growth temperature. In accordance with the teaching of the present invention, the epitaxial layer 13 has a thickness on the same order as the thickness of the substrate 14. In a preferred embodiment of the invention, the substrate is typically 20–100 microns thick and the epitaxial layer is 50–300 microns thick. For example, a 100–150 micron thick layer of GaN epitaxy deposited on a 100 micron thick layer of sapphire is sufficient. The epitaxial layer is deposited using standard chemical vapor deposition techniques, e.g. vapor phase epitaxy. In the preferred embodiment, hydride vapor phase epitaxy is used because it provides a fast growth rate, it is inexpensive and safe. The growth may be performed at high pressure, low pressure, or atmospheric pressure. These techniques are well known in the art and are commonly used to deposit layers as shown in FIGS. 1A and 1B. After the deposition is complete, the temperature of the epitaxial layer and substrate is lowered from the growth temperature and thermal mismatch between the materials causes strain. As shown in FIG. 2b, defects are generated in the substrate 15 because it is relatively thin with respect to the epitaxy. The thermal mismatch strain is now relieved and the epitaxial layer 13 is free of strain.

Figure 3:
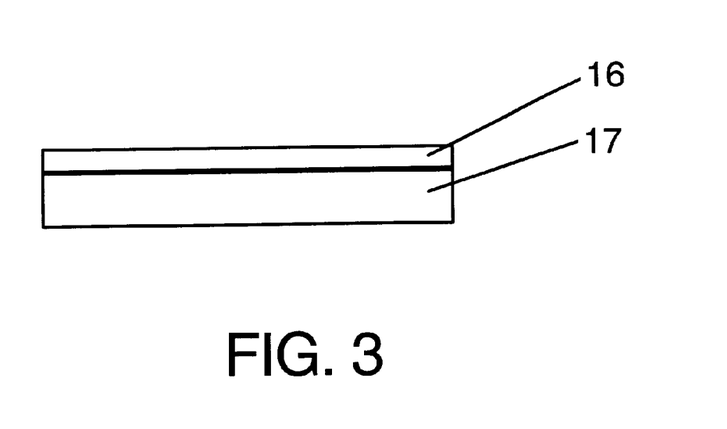
FIG. 3 is a side view diagram showing the deposition of an interlayer on an already thin substrate so that the interlayer will act as the proper nucleation layer for the thick epitaxy to come, while the lower disposable substrate is made of material that is easy thinned.

In some cases, it is difficult to find a substrate material that is a good quality nucleation layer and also can be manufactured with good structural properties to a small enough thickness. In such situations, an additional technique may be used. In FIG. 3 a new compound substrate is shown consisting of a foundational substrate 17, and a thin interlayer 16. The same substrate 15 described above may be used for a foundational substrate 17. The interlayer 16 is typically less than 1 micron thick and is designed to provide flexibility in the choice of foundational substrate material. The interlayer is either predeposited, deposited as an initial component to the epitaxial process, or is formed on the foundational substrate by some surface reaction. Because the interlayer 16 gives some freedom to the substrate choice, more emphasis can be put on manufacturing a substrate 17 that can be thin enough so that defects induced by thermal mismatch strain are generated in the interlayer material and not in the epitaxial layer. The interlayer may be composed of various different materials, for example silicon oxide, silicon nitride, silicon carbide or sapphire.

Figure 4A:
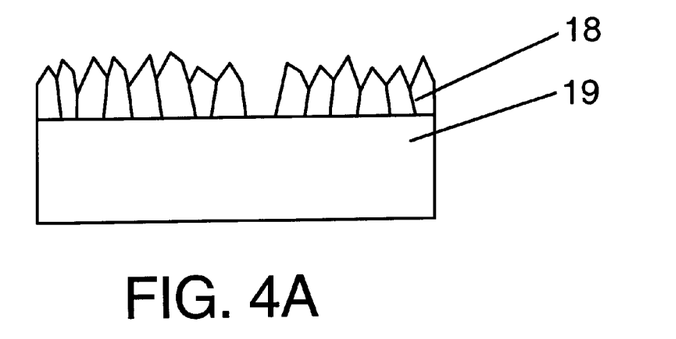
FIGS. 4A and 4B are side view diagrams showing in 4A the deposition of the thick epitaxy of GaN on Si (which is a bad nucleation disposable substrate) and in 4B on sapphire (which is a good nucleation substrate).
Figure 4B:
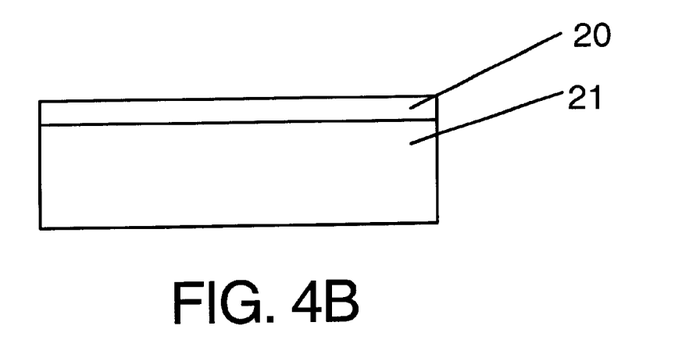
Figure 5:
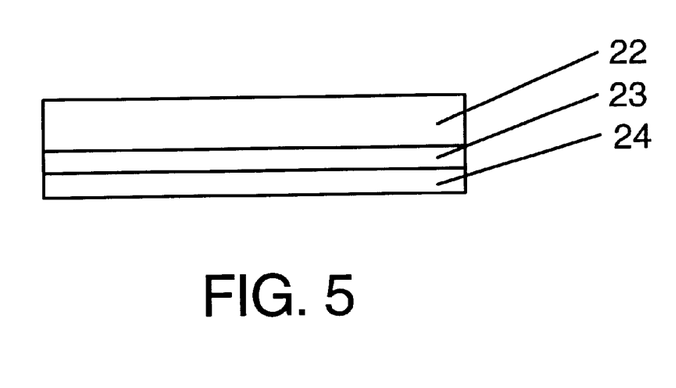
FIG. 5 is a side view diagram of thick epitaxial film on thin Si with a pre-deposited interlayer material that possesses good nucleating qualities, as shown in FIG. 3.

FIG. 4a shows a thin substrate of Si 19 used for the epitaxial deposition of GaN 18. The Si substrate is chosen because it can easily be manufactured to very small thicknesses. However, GaN does not grow properly on the Si substrate, resulting in a rough GaN morphology 18. In comparison, FIG. 4b shows the typical epitaxial deposition 20 of GaN on a sapphire substrate 21. The sapphire substrate is a superior substrate for GaN epitaxial deposition but much more difficult to manufacture into an ultra thin substrate than the Si substrate 19. Accordingly, the present invention provides a solution, as illustrated in FIG. 5. A thin interlayer 23 is deposited on a thin Si substrate 24. Now a thick GaN epitaxial layer 22 can be deposited on the resulting compound substrate with good surface morphology because of the properties of the interlayer, while the substrate will be thin enough with respect to the GaN epitaxy because the Si substrate material choice.

Figure 6A:
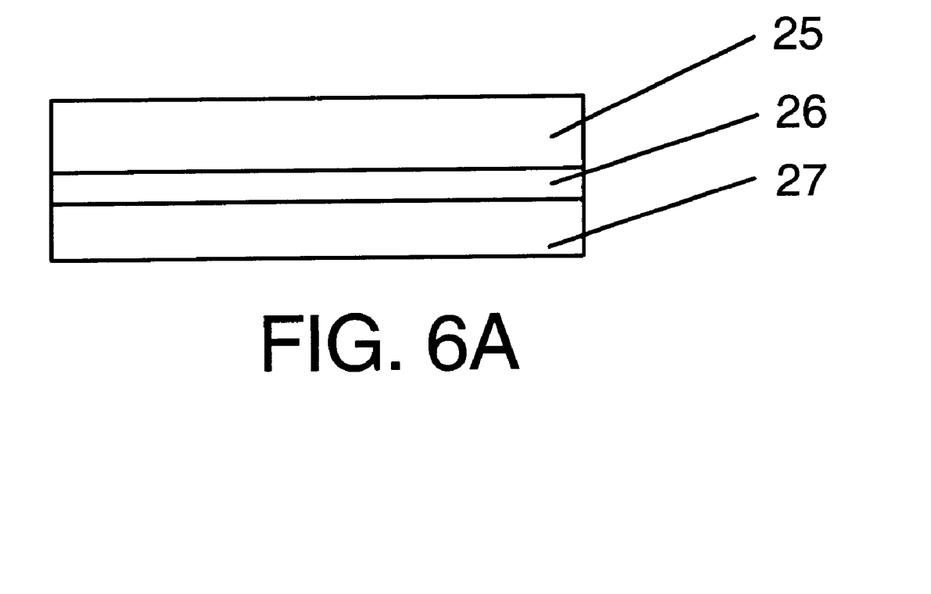
FIGS. 6A and 6B are side view diagrams showing an interlayer deposited between the substrate and epitaxy that is at the growth temperature in 6A and cooled in 6B so that the interlayer cracks (or delaminates) due to thermal mismatch.
Figure 6B:
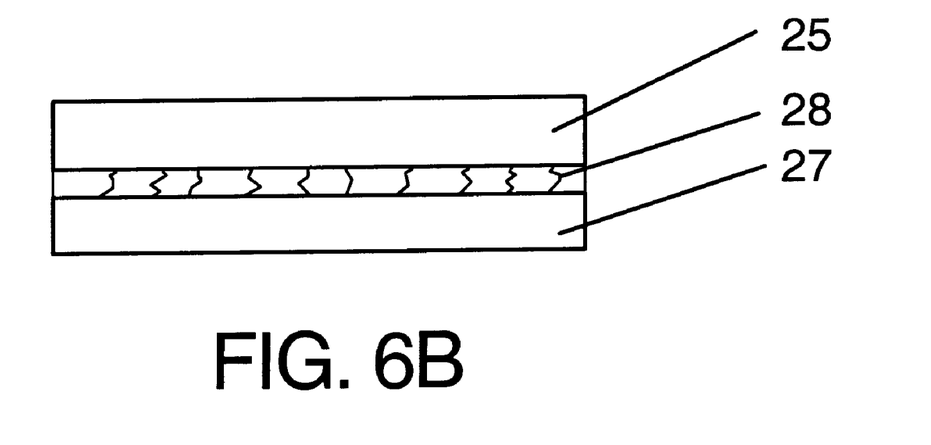

An additional aspect of the invention is the use of an interlayer that is designed to crack or delaminate upon cooling. In such a case the interlayer acts as the thin disposable portion of the substrate. For example, in FIG. 6a where the temperature is the growth temperature, layer 25 is the epitaxy, 26 is the interlayer and 27 is the foundational substrate. In FIG. 6b, the sample has cooled and the thermal mismatch has been absorbed by the interlayer material 28. While the interlayer material is shown here to crack, an interlayer choice which delaminates is also advantageous.

Figure 7A:
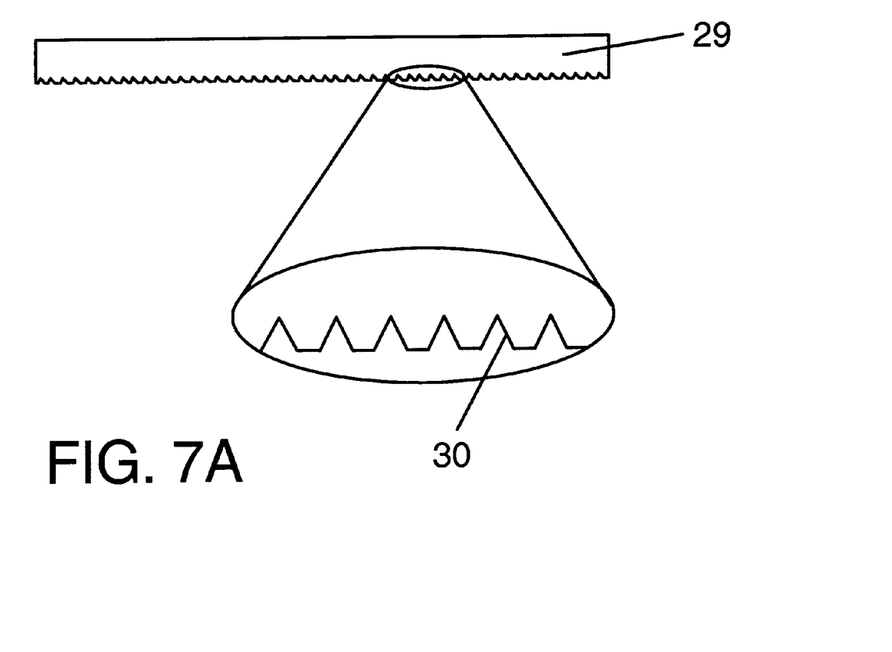
Figure 7B:
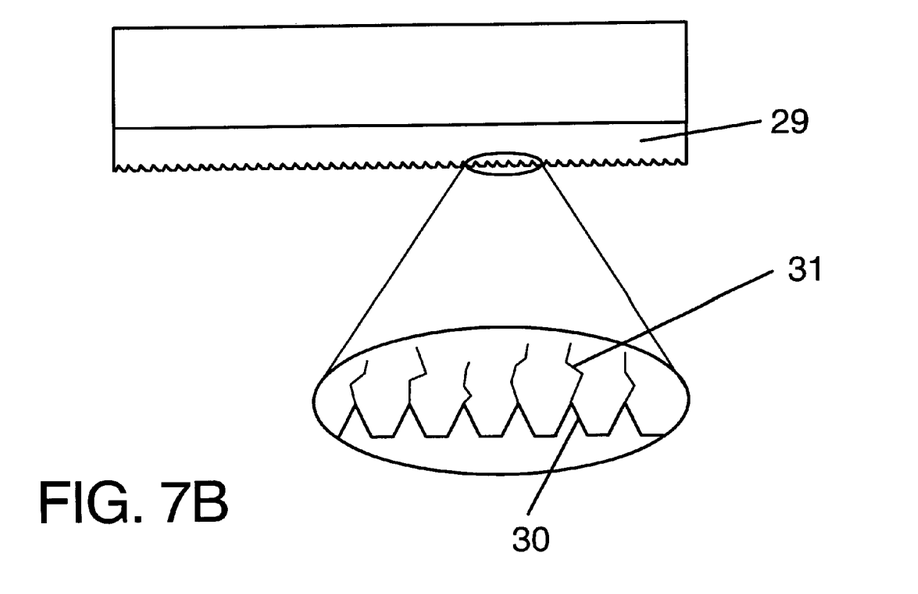
Figure 8A:
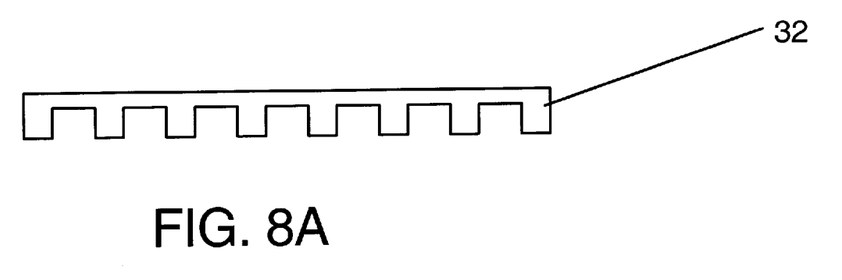
FIGS. 8A and 8B are side view diagrams of a substrate that has been processed to create thin relief areas to facilitate cracking as in FIGS. 7A and 7B. In 8A no epitaxy has been deposited, while in 8B the epitaxy has been deposited, the epitaxy-substrate has cooled and the substrate has cracked.
Figure 8B:
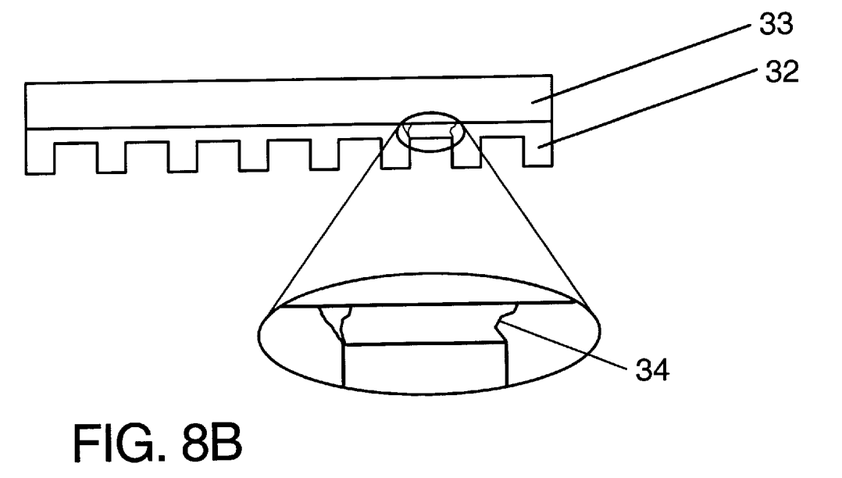

Another aspect of the invention is the addition of processing or patterning to change the shape of the backside of the substrate. In FIG. 7a the backside of the substrate, 28 has been patterned to create sharp pits. Standard chemical vapor deposition techniques, such as vapor phase epitaxy, are used to deposit a thin pattern layer on the order of 0.1 to a few microns in thickness. The pits are typically spaced 10 to 1000 microns apart, although other spacings may be used depending on the particular substrate material and other parameters. These sharp pits are used as defect initiators, as shown in FIG. 7b. When the temperature of the epitaxial layer and substrate changes and thermal mismatch strain increases, these sharp pits will help generate strain relieving defects 29 at the bottom of the substrate. An alternate manifestation of the backside substrate patterning is shown in FIGS. 8A and 8B. In FIG. 8a the backside of the substrate 30 has been patterned so that the substrate is locally thinned. Thus, the entire substrate does not need to be thinned. In FIG. 8b the thick epitaxy 31 has been deposited on the patterned substrate 29. The sample has cooled from the growth temperature and cracks 31 are generated in the thin regions of the substrate, thereby reducing the thermal mismatch strain. In another variation, holes passing all the way through the substrate can form defect initiators.

Another aspect of the invention is the processing or patterning of the top side of the interlayer in a manner analogous to the patterning just described for the bottom side of the substrate. Such patterning results in preferential cracking of the interlayer during cool down. Although portions of the epitaxy may also crack in this case, these damaged portions are limited to a very thin portions between the interlayer patterns and the bulk of the epitaxy remains intact.

What is claimed is:

1. A method for fabricating a thick layer of semiconductor material, the method comprising:

depositing an epitaxial layer of the semiconductor material on a substrate at a growth temperature using a chemical vapor deposition technique, wherein the epitaxial layer has a thickness on the order of a thickness of the substrate, wherein the substrate is a compound substrate comprising a thin interlayer deposited upon a foundational substrate composed of a material selected from the group consisting of silicon, sapphire, and silicon carbide, and wherein the epitaxial layer and the substrate are thermally mismatched; and cooling down the epitaxial layer and the substrate, wherein thermal mismatch between the epitaxial layer and the substrate causes during the cooling down defect generation in the substrate and not in the epitaxy;

whereby a thick, high quality layer of semiconductor material is produced.

2. The method of claim 1 wherein the interlayer is a specific type of buffer layer.

3. The method of claim 1 wherein the thin interlayer is composed of silicon oxide, silicon nitride or silicon carbide.

4. The method of claim 1 wherein the interlayer is patterned such that the defect generation in the compound substrate during cooling down is facilitated.

5. A method for fabricating a thick layer of semiconductor material, the method comprising:

depositing an epitaxial layer of the semiconductor material on a substrate at a growth temperature using a chemical vapor deposition technique, wherein the epitaxial layer has a thickness on the order of a thickness of the substrate, and wherein the epitaxial layer and the substrate are thermally mismatched; and cooling down the epitaxial layer and the substrate, wherein thermal mismatch between the epitaxial layer and the substrate causes during the cooling down defect generation in the substrate and not in the epitaxy;

wherein the substrate is patterned such that the defect generation in the substrate during cooling down is facilitated;

whereby a thick, high quality layer of semiconductor material is produced.

6. The method of claim 5 wherein the semiconductor material is GaN or a related III–V, II–VI, or IV compound or alloy.

7. A layer of semiconductor material made according to the method of claim 5.

8. A layer of semiconductor material epitaxially deposited on a substrate, wherein the layer of semiconductor material has a thickness on the order of a thickness of the substrate, wherein the epitaxial layer and the substrate are thermally mismatched, wherein the substrate is patterned, and wherein defects are present in the substrate due to thermal mismatch.

9. The layer of claim 8 wherein the semiconductor material is GaN or a related III–V, II–VI, or IV compound or alloy.

10. The layer of claim 8 wherein the substrate is a compound substrate comprising a thin interlayer deposited upon a foundational substrate of silicon, sapphire, or silicon carbide.

11. The layer of claim 10 wherein defects are present in the thin interlayer portion of the substrate.

12. The layer of claim 10 wherein defects are present in the foundational substrate portion of the substrate.

13. The layer of claim 10 wherein the interlayer is patterned.

14. A method of fabricating an epitaxial layer of semiconductor material on a thermally mismatched substrate without inducing thermal mismatch defects in the epitaxial layer, the method comprising:

chemical vapor phase depositing the epitaxial layer of the semiconductor material on the thermally mismatched substrate at a growth temperature, wherein the deposited epitaxial layer is deposited to a thickness on the same order as a thickness of the substrate, wherein the substrate comprises a material chosen from the group consisting of sapphire, silicon, silicon oxide, silicon nitride, and silicon carbide, and wherein the epitaxial layer of semiconductor material comprises a material chosen from the group consisting of GaN, InN, AlN, and alloys of GaN, InN, and AlN; and generating thermal mismatch defects in the substrate by cooling down from the growth temperature the substrate and the deposited epitaxial layer, wherein the thermal mismatch defects generated in the substrate relieve thermal mismatch strain between the substrate and epitaxial layer caused by cooling;

whereby the epitaxial layer is fabricated on a thermally mismatched substrate without inducing thermal mismatch defects in the bulk of the epitaxial layer.

15. The method of claim 14 wherein the substrate is patterned with defect initiators that facilitate the generation of defects in the substrate during cooling.

16. The method of claim 14 wherein the substrate is a compound substrate comprising a foundational substrate and a thin interlayer.

17. The method of claim 16 wherein the thermal mismatch defects generated in the substrate are generated in the thin interlayer.

18. The method of claim 17 wherein the interlayer is patterned to facilitate preferential cracking of the interlayer during cooling.

19. The method of claim 17 wherein the thermal mismatch defects generated in the interlayer cause delamination of the interlayer during cooling.

20. The method of claim 16 wherein the foundational substrate is composed of Si, and the thin interlayer is composed of a material selected from the group consisting of silicon oxide, silicon nitride, silicon carbide, and sapphire.

21. The method of claim 14 wherein the substrate has a thickness of 20–100 microns and the epitaxial layer has a thickness of 50–300 microns.

22. The method of claim 14 wherein the epitaxial layer is composed of GaN.

23. The method of claim 14 wherein the chemical vapor phase depositing comprises hydride vapor phase epitaxy depositing.

24. A semiconductor material comprising:
   a substrate comprising a material chosen from the group consisting of sapphire, silicon, silicon oxide, silicon nitride, and silicon carbide; and
   an epitaxial layer comprising a material chosen from the group consisting of GaN, InN, AlN, and alloys of GaN, InN, and AlN;
   wherein the epitaxial layer is deposited on the substrate;
   wherein the substrate and epitaxial layer are thermally mismatched;
   wherein the epitaxial layer has a thickness on the same order as a thickness of the substrate; and
   wherein the substrate contains thermal mismatch defects caused by cooling down from the growth temperature the substrate and the epitaxial layer deposited on the substrate; and
   wherein the bulk of the epitaxial layer contains no thermal mismatch defects.

25. The semiconductor material of claim 24 wherein the substrate is patterned with defect initiators where the thermal mismatch defects in the substrate originate.

26. The semiconductor material of claim 24 wherein the substrate is a compound substrate comprising a foundational substrate and a thin interlayer.

27. The semiconductor material of claim 26 wherein the thermal mismatch defects in the substrate are located in the thin interlayer.

28. The semiconductor material of claim 26 wherein the foundational substrate is composed of Si, and the thin interlayer is composed of a material selected from the group consisting of silicon oxide, silicon nitride, silicon carbide, and sapphire.

29. The semiconductor material of claim 24 wherein the substrate has a thickness of 20–100 microns and the epitaxial layer has a thickness of 50–300 microns.

30. The semiconductor material of claim 24 wherein the epitaxial layer is composed of GaN.

* * * * *